US011262924B2

(12) United States Patent
Alverson et al.

(10) Patent No.: US 11,262,924 B2
(45) Date of Patent: Mar. 1, 2022

(54) AUTOMATIC MEMORY OVERCLOCKING

(71) Applicant: ADVANCED MICRO DEVICES, INC., Santa Clara, CA (US)

(72) Inventors: William R. Alverson, Austin, TX (US); Amitabh Mehra, Fort Collins, CO (US); Anil Harwani, Austin, TX (US); Jerry A. Ahrens, Austin, TX (US); Grant E. Ley, Austin, TX (US); Jayesh Joshi, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/729,702

(22) Filed: Dec. 30, 2019

(65) Prior Publication Data

US 2021/0200456 A1    Jul. 1, 2021

(51) Int. Cl.
*G06F 3/06*   (2006.01)
*G11C 29/10*   (2006.01)

(52) U.S. Cl.
CPC .......... *G06F 3/0632* (2013.01); *G06F 3/0604* (2013.01); *G06F 3/0673* (2013.01); *G11C 29/10* (2013.01)

(58) Field of Classification Search
CPC .... G06F 3/0632; G06F 3/0604; G06F 3/0673; G11C 29/10; G11C 29/028; G11C 29/16
See application file for complete search history.

(56) References Cited

U.S. PATENT DOCUMENTS

| 2010/0115351 | A1* | 5/2010 | Lin | G11C 29/16 714/718 |
| 2010/0131221 | A1* | 5/2010 | Chien | G11C 29/028 702/81 |
| 2015/0016191 | A1* | 1/2015 | Tsai | G11C 29/12015 365/185.18 |
| 2018/0188769 | A1 | 7/2018 | Chen et al. | |
| 2018/0188770 | A1 | 7/2018 | Chen et al. | |

FOREIGN PATENT DOCUMENTS

| CN | 1368684 A * | 9/2002 | ............ G06F 13/10 |
| WO | 2019245558 A1 | 12/2019 | |

OTHER PUBLICATIONS

Fahrizal et al., Analysis of effect overclocking durability on intel processor i5 4670K, IEEE, pp. 1 to 4. (Year: 2016).*
International Search Report and Written Opinion, PCT/US2020/066464, dated Apr. 14, 2021, 11 pages.

* cited by examiner

*Primary Examiner* — Shelly A Chase

(57) ABSTRACT

Automatic memory overclocking, including: increasing a memory frequency setting for a memory module until a memory stability test fails; determining an overclocked memory frequency setting including a highest memory frequency setting passing the memory stability test; and generating a profile including the overclocked memory frequency setting.

17 Claims, 5 Drawing Sheets

AUTOMATIC MEMORY OVERCLOCKING

BACKGROUND

Settings for memory modules can be configured according to vendor profiles or user input specifications. These profiles are often generated and tested using system configurations differing from a user system. Additionally, user input specifications may be restricted using margins determined and tested using these differing system configurations.

DETAILED DESCRIPTION

Figure 1:
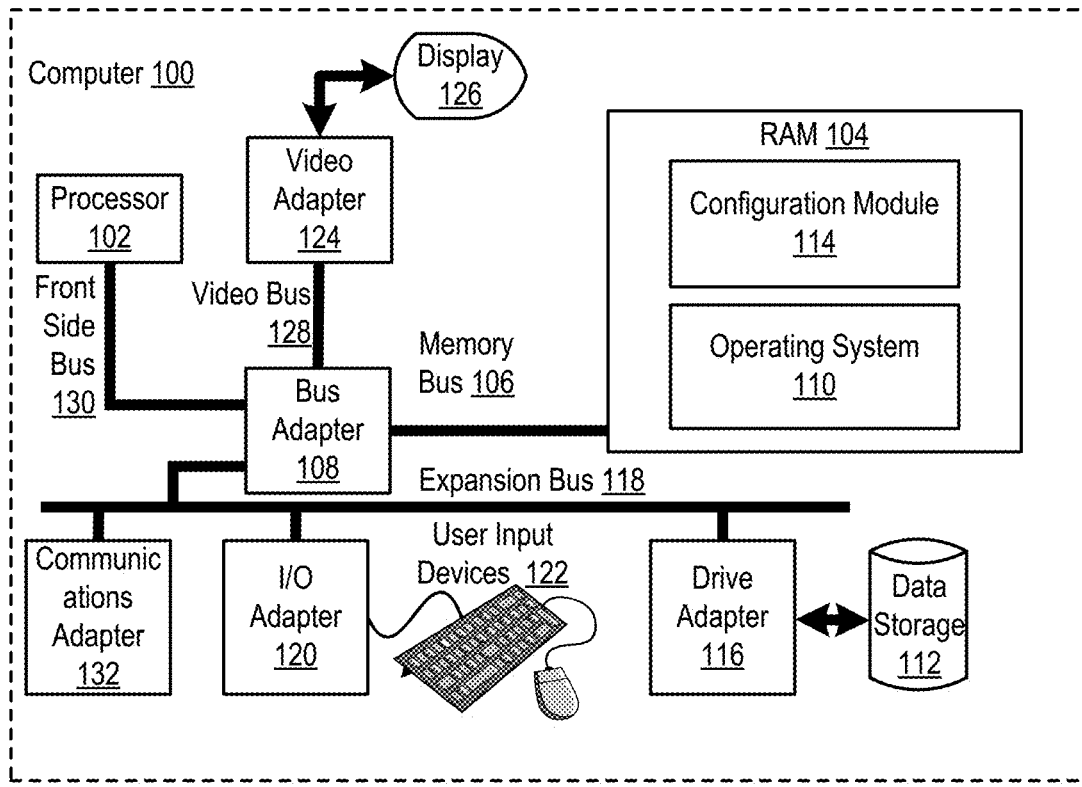
FIG. 1 is a block diagram of an example processor for automatic memory overclocking according to some embodiments.

In some embodiments, a method of automatic memory overclocking includes: increasing a memory frequency setting for a memory module until a memory stability test fails; determining an overclocked memory frequency setting including a highest memory frequency setting passing the memory stability test; and generating a profile including the overclocked memory frequency setting.

In some embodiments, increasing the memory frequency setting for the memory module until the memory stability test fails includes determining one or more memory timing settings, and the method further includes: determining one or more overclocked memory timing settings including the one or more memory timing settings corresponding to the overclocked memory frequency setting; and wherein generating the profile includes including the one or more overclocked memory timing settings in the profile. In some embodiments, the one or more memory timing settings include one or more of: a Column Access Strobe (CAS) latency, a Row Address Strobe (RAS) to Column Address Strobe (CAS) Delay (Write), a Row Address Strobe (RAS) to Column Address Strobe (CAS) Delay (Read), a Row Precharge Time, and/or a Row Active Time. In some embodiments, the method further includes: determining one or more subtiming settings based on the overclocked memory frequency setting and/or the one or more overclocked memory timing settings; and wherein generating the profile includes including the one or more subtiming settings in the profile. In some embodiments, the one or more subtiming settings are based on one or more rules applied to the overclocked memory frequency setting and/or the one or more memory timing settings. In some embodiments, the method further includes storing the profile in a storage location. In some embodiments, the method further includes: loading the profile from the storage location; and applying the profile to the memory module.

In some embodiments, an apparatus for automatic memory overclocking performs steps including: increasing a memory frequency setting for a memory module until a memory stability test fails; determining an overclocked memory frequency setting including a highest memory frequency setting passing the memory stability test; and generating a profile including the overclocked memory frequency setting.

In some embodiments, increasing the memory frequency setting for the memory module until the memory stability test fails includes determining one or more memory timing settings, and the steps further include: determining one or more overclocked memory timing settings including the one or more memory timing settings corresponding to the overclocked memory frequency setting; and wherein generating the profile includes including the one or more overclocked memory timing settings in the profile. In some embodiments, the one or more memory timing settings include one or more of: a Column Access Strobe (CAS) latency, a Row Address Strobe (RAS) to Column Address Strobe (CAS) Delay (Write), a Row Address Strobe (RAS) to Column Address Strobe (CAS) Delay (Read), a Row Precharge Time, and/or a Row Active Time. In some embodiments, the steps further include: determining one or more subtiming settings based on the overclocked memory frequency setting and/or the one or more overclocked memory timing settings; and wherein generating the profile includes including the one or more subtiming settings in the profile. In some embodiments, the one or more subtiming settings are based on one or more rules applied to the overclocked memory frequency setting and/or the one or more memory timing settings. In some embodiments, the steps further include storing the profile in a storage location. In some embodiments, the steps further include: loading the profile from the storage location; and applying the profile to the memory module.

In some embodiments, a computer program product disposed upon a non-transitory computer readable medium includes computer program instructions for automatic memory overclocking that, when executed, cause a computer to perform steps including: increasing a memory frequency setting for a memory module until a memory stability test fails; determining an overclocked memory frequency setting including a highest memory frequency setting passing the memory stability test; and generating a profile including the overclocked memory frequency setting.

In some embodiments, increasing the memory frequency setting for the memory module until the memory stability test fails includes determining one or more memory timing settings, and the steps further include: determining one or more overclocked memory timing settings including the one or more memory timing settings corresponding to the overclocked memory frequency setting; and wherein generating the profile includes including the one or more overclocked memory timing settings in the profile. In some embodiments, the one or more memory timing settings include one or more of: a Column Access Strobe (CAS) latency, a Row Address Strobe (RAS) to Column Address Strobe (CAS) Delay (Write), a Row Address Strobe (RAS) to Column Address Strobe (CAS) Delay (Read), a Row Precharge Time, and/or a Row Active Time. In some embodiments, the steps further include: determining one or more subtiming settings based on the overclocked memory frequency setting and/or the one or more overclocked memory timing settings; and wherein generating the profile includes including the one or more subtiming settings in the profile. In some embodiments, the one or more subtiming settings are based on one or more rules applied to the overclocked memory frequency setting and/or the one or more memory timing settings. In some embodiments, the steps further include storing the profile in a storage location. In some embodiments, the steps further include: loading the profile from the storage location; and applying the profile to the memory module.

Automatic memory overclocking in accordance with the present disclosure is generally implemented with computers, that is, with automated computing machinery. For further explanation, therefore, FIG. 1 sets forth a block diagram of automated computing machinery including an exemplary computer 100 configured for automatic memory overclocking. The computer 100 of FIG. 1 includes at least one computer processor 102 or 'CPU' as well as random access memory 104 ('RAM') which is connected through a high speed memory bus 106 and bus adapter 108 to processor 102 and to other components of the computer 100.

Stored in RAM 104 is an operating system 110. Operating systems useful in computers configured for automatic memory overclocking include UNIX™, Linux™, Microsoft Windows™, and others as will occur to those of skill in the art. The operating system 110 in the example of FIG. 1 is shown in RAM 104, but many components of such software typically are stored in non-volatile memory also, such as, for example, on data storage 112, such as a disk drive. Also stored in RAM is the configuration module 114, which is a module for automatic memory overclocking.

The computer 100 of FIG. 1 includes disk drive adapter 116 coupled through expansion bus 118 and bus adapter 108 to processor 102 and other components of the computer 100. Disk drive adapter 116 connects non-volatile data storage to the computer 100 in the form of data storage 112. Disk drive adapters useful in computers configured for automatic memory overclocking include Integrated Drive Electronics (IDE') adapters, Small Computer System Interface ('SCSI') adapters, and others as will occur to those of skill in the art. In some embodiments, non-volatile computer memory is implemented as an optical disk drive, electrically erasable programmable read-only memory (so-called 'EEPROM' or 'Flash' memory), RAM drives, and so on, as will occur to those of skill in the art.

The example computer 100 of FIG. 1 includes one or more input/output ('I/O') adapters 120. I/O adapters implement user-oriented input/output through, for example, software drivers and computer hardware for controlling output to display devices such as computer display screens, as well as user input from user input devices 122 such as keyboards and mice. The example computer 100 of FIG. 1 includes a video adapter 124, which is an example of an I/O adapter specially designed for graphic output to a display device 126 such as a display screen or computer monitor. Video adapter 124 is connected to processor 102 through a high speed video bus 128, bus adapter 108, and the front side bus 130, which is also a high speed bus.

The exemplary computer 100 of FIG. 1 includes a communications adapter 132 for data communications with other computers and for data communications with a data communications network. Such data communications are carried out serially through RS-232 connections, through external buses such as a Universal Serial Bus ('USB'), through data communications networks such as IP data communications networks, and/or in other ways as will occur to those of skill in the art. Communications adapters implement the hardware level of data communications through which one computer sends data communications to another computer, directly or through a data communications network. Examples of communications adapters useful in computers configured for automatic memory overclocking include modems for wired dial-up communications, Ethernet (IEEE 802.3) adapters for wired data communications, and 802.11 adapters for wireless data communications.

Figure 2:
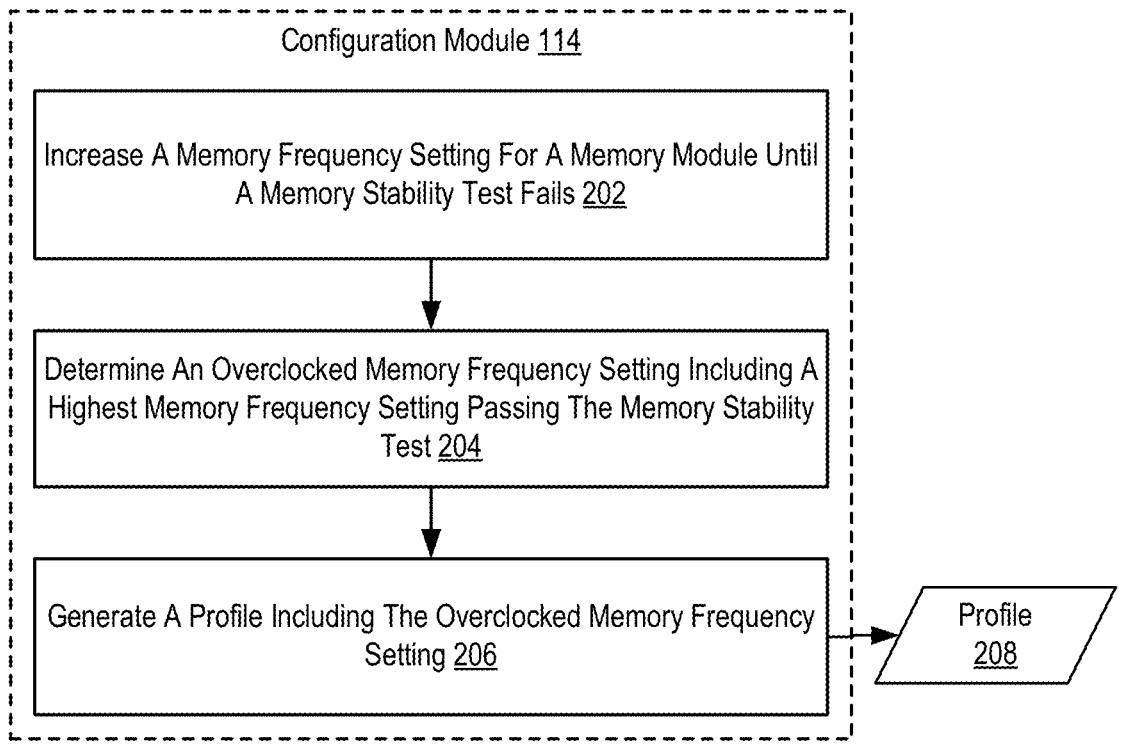
FIG. 2 is a flowchart of an example method for automatic memory overclocking according to some embodiments.

For further explanation, FIG. 2 sets forth a flow chart illustrating an exemplary method for automatic memory overclocking that includes increasing 202 (e.g., by a configuration module 114) a memory frequency setting for a memory module until a memory stability test fails. A memory module is a set of one or more Random Access Memory chips within a same circuit board (e.g., a same Dual In-Line Memory Module (DIMM)). The memory frequency setting is a clock speed for the memory module (e.g., 1000 megahertz, 3000 megahertz, etc.).

For example, the configuration module 114 increases the memory frequency setting at a predefined interval (e.g., 100 megahertz, or another interval) beginning from a baseline memory frequency setting (e.g., a current memory frequency setting for the memory module, a predefined minimum frequency setting, etc.). After increasing the memory frequency setting, the configuration module 114 performs one or more memory stability tests on the memory module. The memory stability tests are based on one or more data integrity checks, including Error Correction Code checks or other approaches for detecting bit errors as can be appreciated. For example, the configuration module 114 may perform one or more reads and/or writes of data to the memory module and determine if an error is found in the read and/or written data.

If the memory module passes the one or more memory stability tests, the configuration module 114 then increases the memory frequency setting and performs the one or more memory stability tests. This process repeats until a memory stability test fails. In some embodiments, in response to a memory stability test failing, the configuration module 114 reduces the memory frequency setting to a memory frequency setting greater than the memory frequency setting that last passed the memory stability tests but less than the memory frequency setting that failed the memory stability test. For example, assume a memory module passes the memory stability tests at 2800 megahertz. After increasing the memory frequency setting by the predefined interval of 200 megahertz, the memory module fails a memory stability test at 3000 megahertz. The configuration module 114 then reduces the memory frequency setting to 2900 megahertz and performs the memory stability tests. One skilled in the art would appreciate that such an approach can be performed repeatedly to effectively search for a highest memory frequency setting that will pass the memory stability tests.

The method of FIG. 2 also includes determining 204 (e.g., by the configuration module 114) an overclocked memory frequency setting including a highest memory frequency setting passing the memory stability test. For example, assuming that the configuration module 114 increments the memory frequency setting for the memory module at an interval of 100 megahertz, that the memory frequency setting for 2900 megahertz passes the memory stability test while the setting for 3000 megahertz fails. The overclocked memory frequency setting would then be determined 204 as 2900 megahertz.

The method of FIG. 2 also includes generating 206 (e.g., by the configuration module 114) a profile 208 including the overclocked memory frequency setting. For example, the profile 208 is generated 206 as data indicating one or more settings for the memory module including the overclocked memory frequency setting. One skilled in the art would appreciate that the method of FIG. 2 can be repeated for each memory module in a computing system such that profiles 208 are generated for each memory module, or a profile 208 is generated indicating settings for each memory module. The configuration module 114 is described as a software-based process (e.g., implemented in Random Access Memory 104). One skilled in the art would appreciate that, in an alternative embodiment, the configuration module 114 is implemented at least in part in a memory controller or other hardware component.

Figure 3:
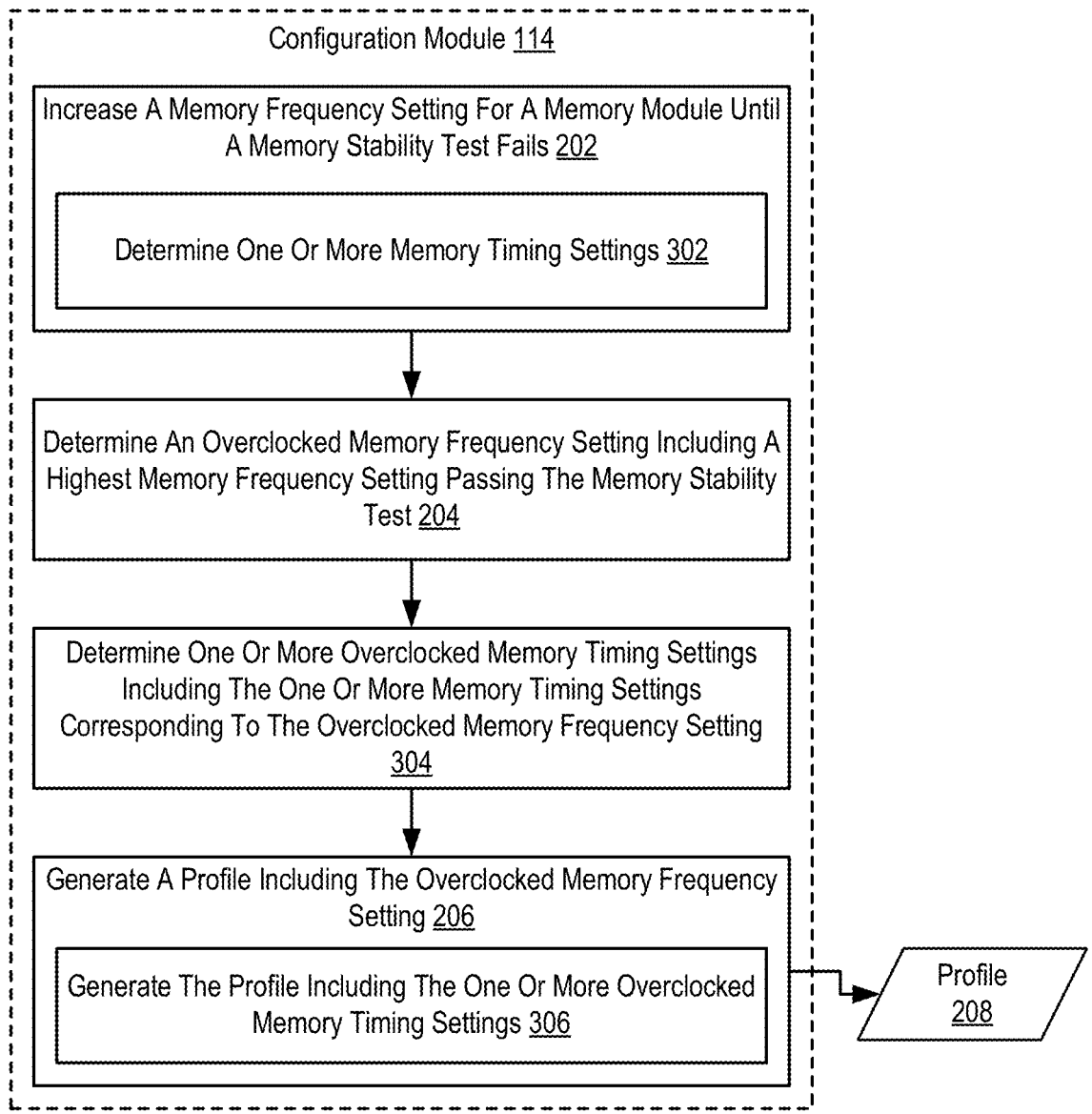
FIG. 3 is a flowchart of an example method for automatic memory overclocking according to some embodiments.

For further explanation, FIG. 3 sets forth a flow chart illustrating an exemplary method for automatic memory overclocking that includes increasing 202 (e.g., by a configuration module 114) a memory frequency setting for a memory module until a memory stability test fails; determining 204 an overclocked memory frequency setting including a highest memory frequency setting passing the memory stability test; and generating 206 a profile 208 including the overclocked memory frequency setting.

The method of FIG. 3 differs from FIG. 2 in that increasing 202 a memory frequency setting for a memory module until a memory stability test fails also includes determining 302 one or more memory timing settings. The memory timing settings include, for example, one or more of: a Column Access Strobe (CAS) latency, a Row Address Strobe (RAS) to Column Address Strobe (CAS) Delay (Write), a Row Address Strobe (RAS) to Column Address Strobe (CAS) Delay (Read), a Row Precharge Time, and/or a Row Active Time.

In an embodiment, determining 302 the one or more memory timing settings includes determining 302 the one or more memory timing settings as one or more minimum timing settings. For example, the memory module includes default minimum thresholds for one or more of the memory timing settings. One or more of the memory timing settings are then determined as a minimum threshold. In an embodiment, determining 302 the one or more memory timing settings includes determining 302 one or more of the memory timing settings as a function of one or more other minimum timing settings. For example, a first memory timing setting is determined as a minimum timing setting, and a second memory timing setting is determined as a function of the first memory timing setting (e.g., using a formula or other rules). After determining 302 the one or more minimum timing settings, the memory timing settings are applied to the memory module prior to performing one or more memory timing settings.

In an embodiment, after failing a memory stability test at a given frequency, the configuration module 114 increases one or more of the memory timing settings until a threshold for a memory timing setting is reached, or until the memory stability test is passed. Thus, a memory frequency setting passes the memory stability test using the increased memory timing settings.

The method of FIG. 3 also includes determining one or more overclocked memory timing settings including the one or more memory timing settings corresponding to the overclocked memory frequency setting. In other words, the one or more overclocked memory timing settings are those minimum memory timing settings applied to the memory module when the overclocked memory frequency setting passed the memory stability test.

The method of FIG. 3 further differs from FIG. 2 in that generating 206 a profile 208 including the overclocked memory frequency setting also includes generating 306 the profile 208 including the one or more overclocked memory timing settings. Thus, the generated 206 profile 208 indicates the overclocked memory frequency setting and the one or more overclocked memory timing settings for the memory module.

Figure 4:
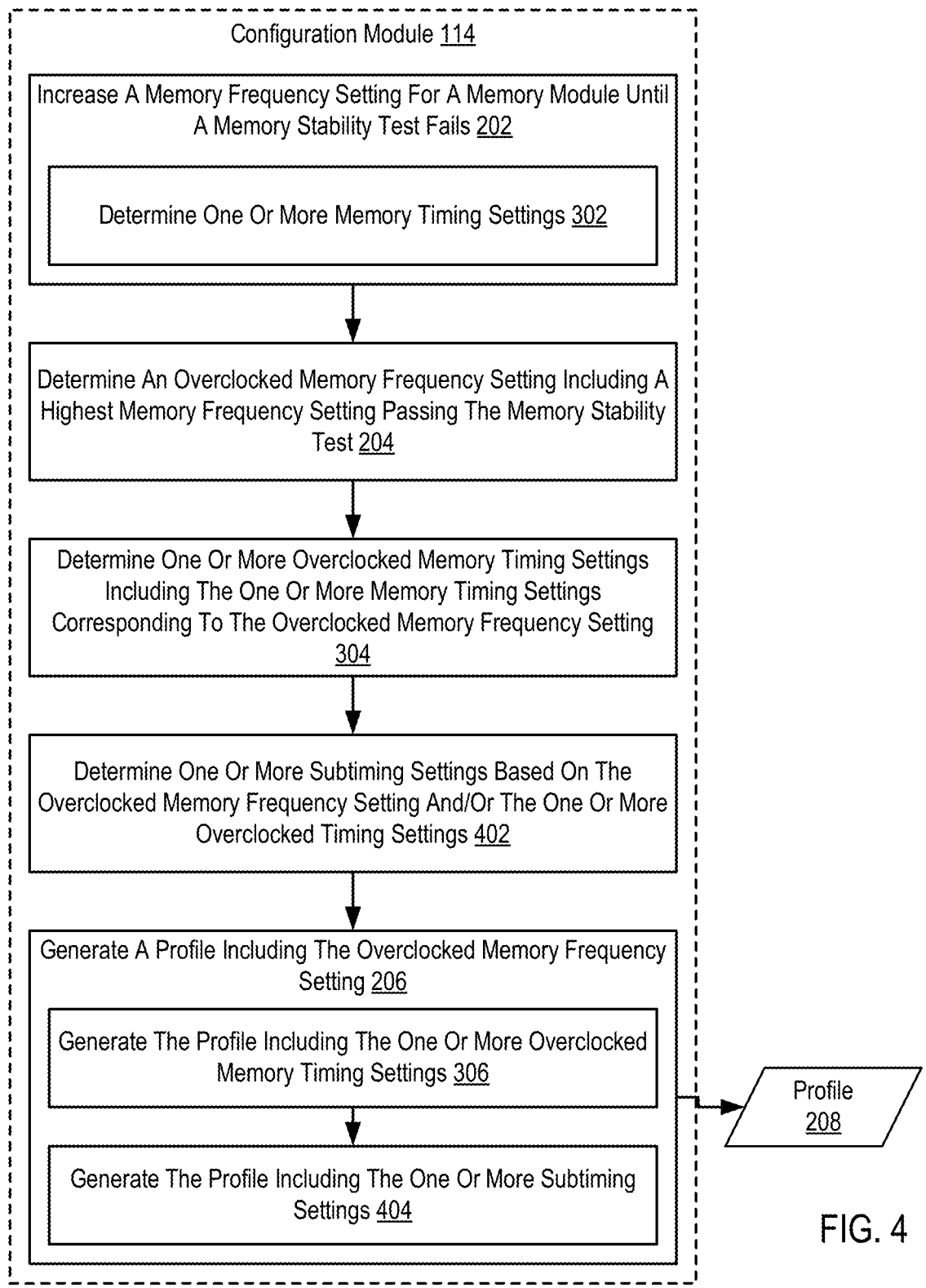
FIG. 4 is a flowchart of an example method for automatic memory overclocking according to some embodiments.

For further explanation, FIG. 4 sets forth a flow chart illustrating an exemplary method for automatic memory overclocking that includes increasing 202 (e.g., by a configuration module 114) a memory frequency setting for a memory module until a memory stability test fails including determining 302 one or more memory timing settings; determining 204 an overclocked memory frequency setting including a highest memory frequency setting passing the memory stability test; determining 304 one or more overclocked memory timing settings including the one or more memory timing settings corresponding to the overclocked memory frequency setting; and generating 206 a profile 208 including the overclocked memory frequency setting by generating 306 the profile including the one or more overclocked memory timing settings.

The method of FIG. 4 differs from FIG. 3 in that the method of FIG. 4 also includes determining 402 one or more subtiming settings based on the overclocked memory frequency setting and/or the one or more overclocked timing settings. Examples of subtiming settings include a Page Time Line Period setting; a RAS to RAS Delay, Different Bank Group setting (e.g., the delay between two row activations across different bank groups), a RAS to RAS Delay, Same Bank Group setting (e.g., the delay between two row activations within a same bank group); a Four Activate Window setting (e.g., the amount of time in which four row activations can occur within the same rank); a Write to Read Delay, Different Bank Group setting (e.g., the delay between a successful write command and a read command across different bank groups); a Write to Read Delay, Same Bank Group setting (e.g., the delay between a successful write command and a read command within a same bank group); a Write Recovery Time setting (e.g., a delay between a successful write command and the active bank being precharged), and other settings as can be appreciated.

In an embodiment, one or more subtiming settings are determined based on one or more of the overclocked memory timing settings. For example, a Row Cycle Time setting is determined as the sum of a Row Precharge Time setting and Row Address Strobe (RAS) Active Time setting in the overclocked memory frequency settings. In an embodiment, one or more subtiming settings are determined based one or more thresholds. For example, a setting determined via a formula that falls below a threshold may be instead determined to be the threshold amount. In an embodiment, one or more subtiming settings are determined based on one or more other subtiming settings. For example, a Four Activate Window setting is determined as four times the RAS to RAS Delay, Different Bank Group setting. In other words, the one or more subtiming settings are determined based on one or more rules.

The method of FIG. 4 further differs from FIG. 3 in that generating 206 a profile 208 including the overclocked memory frequency setting also includes generating 404 the profile 208 including the one or more subtiming settings. Thus, the generated 206 profile 208 indicates the overclocked memory frequency setting, the one or more overclocked memory timing settings, and the one or more subtiming settings for the memory module.

Figure 5:
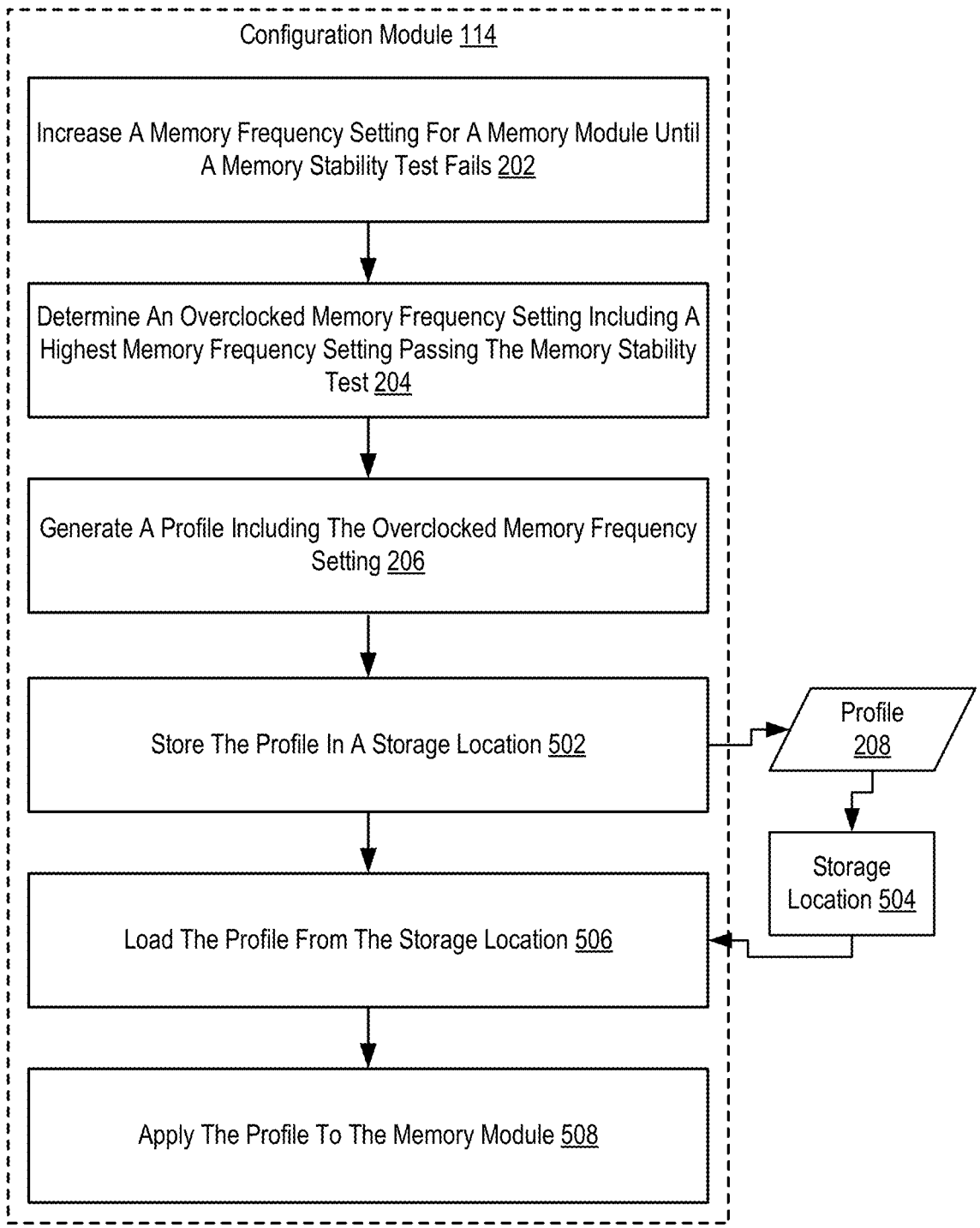
FIG. 5 is a flowchart of an example method for automatic memory overclocking according to some embodiments.

For further explanation, FIG. 5 sets forth a flow chart illustrating an exemplary method for automatic memory overclocking that includes increasing 202 (e.g., by a configuration module 114) a memory frequency setting for a memory module until a memory stability test fails; determining 204 an overclocked memory frequency setting including a highest memory frequency setting passing the memory stability test; and generating 206 a profile 208 including the overclocked memory frequency setting.

The method of FIG. 5 differs from FIG. 2 in that the method of FIG. 5 also includes storing 502 the profile in a storage location 504. In an embodiment, the storage location 504 includes non-volatile memory of a computing system including the memory module (e.g., disk storage, a Basic Input/Output System scratch table, etc. In another embodiment, the storage location 504 includes non-volatile storage on the memory module itself, such as on-module (e.g., on Dual In-Line Memory Module (DIMM)) Serial Presence Detect (SPD) Electrically Erasable Programmable Read-Only Memory (EEPROM).

The method of FIG. 5 also includes loading 506 the profile from the storage location 504. For example, the profile 208 is loaded 506 from the storage location 504 as part of a boot process of a computing system including the memory module. The method of FIG. 5 also includes applying 508 the profile 208 to the memory module. Applying 508 the profile 208 to the memory module includes configuring the memory module to operate using the settings (e.g., the overclocked memory frequency setting, overclocked memory timing settings, and/or subtiming settings) indicated in the profile 208.

In existing solutions, memory modules are configured using profiles provided by a manufacturer or vendor of the memory module, which are tested under configuration settings that may differ from the end user (e.g., different chip or motherboard manufacturers or designers) Though users can modify the settings in these profiles, they are restricted using margins based on these differing configuration settings. Using the approaches set forth above, configuration settings of the memory module are determined and optimized based on the real capabilities of the computing system in which the memory module is implemented.

In view of the explanations set forth above, readers will recognize that the benefits of automatic memory overclocking include:

Improved performance of a computing system by optimizing memory overclocking settings to reflect current user system configurations and operating environments.

Exemplary embodiments of the present disclosure are described largely in the context of a fully functional computer system for automatic memory overclocking. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method of automatic memory overclocking, the method comprising:
increasing a memory frequency setting for a memory module until a memory stability test fails;
determining an overclocked memory frequency setting comprising a highest memory frequency setting passing the memory stability test;
determining one or more overclocked memory timing settings comprising one or more memory timing settings corresponding to the overclocked memory frequency setting; and
generating a profile comprising the overclocked memory frequency setting and the one or more overclocked memory timing settings.

2. The method of claim 1, wherein the one or more memory timing settings comprise one or more of: a Column Access Strobe (CAS) latency, a Row Address Strobe (RAS) to Column Address Strobe (CAS) Delay (Write), a Row Address Strobe (RAS) to Column Address Strobe (CAS) Delay (Read), a Row Precharge Time, and/or a Row Active Time.

3. The method of claim 1, further comprising:
determining one or more subtiming settings based on the overclocked memory frequency setting and the one or more overclocked memory timing settings; and
wherein generating the profile comprises including the one or more subtiming settings in the profile.

4. The method of claim 3, wherein the one or more subtiming settings are based on one or more rules applied to the overclocked memory frequency setting and/or the one or more memory timing settings.

5. The method of claim 1, further comprising storing the profile in a storage location.

6. The method of claim 5, further comprising:
loading the profile from the storage location; and
applying the profile to the memory module.

7. An apparatus for automatic memory overclocking, the apparatus configured to:
increase a memory frequency setting for a memory module until a memory stability test fails;
determine an overclocked memory frequency setting comprising a highest memory frequency setting passing the memory stability test;
determine one or more overclocked memory timing settings comprising one or more memory timing settings corresponding to the overclocked memory frequency setting; and
generate a profile comprising the overclocked memory frequency setting and the one or more overclocked memory timing settings.

8. The apparatus of claim 7, wherein the one or more memory timing settings comprise one or more of: a Column Access Strobe (CAS) latency, a Row Address Strobe (RAS) to Column Address Strobe (CAS) Delay (Write), a Row Address Strobe (RAS) to Column Address Strobe (CAS) Delay (Read), a Row Precharge Time, and/or a Row Active Time.

9. The apparatus of claim 7, further configured to: determine one or more subtiming settings based on the overclocked memory frequency setting and the one or more overclocked memory timing settings; and wherein generating the profile comprises including the one or more subtiming settings in the profile.

10. The apparatus of claim 9, wherein the one or more subtiming settings are based on one or more rules applied to the overclocked memory frequency setting and/or the one or more memory timing settings.

11. The apparatus of claim 7, further configured to store the profile in a storage location.

12. The apparatus of claim 11, further configured to:
load the profile from the storage location; and
apply the profile to the memory module.

13. A computer program product disposed upon a non-transitory computer readable medium, the computer program product comprising computer program instructions for automatic memory overclocking that, when executed, cause a computer to perform steps comprising:
increasing a memory frequency setting for a memory module until a memory stability test fails;
determining an overclocked memory frequency setting comprising a highest memory frequency setting passing the memory stability test;
determining one or more overclocked memory timing settings comprising one or more memory timing settings corresponding to the overclocked memory frequency setting; and
generating a profile comprising the overclocked memory frequency setting and the one or more overclocked memory timing settings.

14. The computer program product of claim 13, wherein the one or more memory timing settings comprise one or more of: a Column Access Strobe (CAS) latency, a Row Address Strobe (RAS) to Column Address Strobe (CAS) Delay (Write), a Row Address Strobe (RAS) to Column Address Strobe (CAS) Delay (Read), a Row Precharge Time, and/or a Row Active Time.

15. The computer program product of claim 13, wherein the steps further comprise:
determining one or more subtiming settings based on the overclocked memory frequency setting and the one or more overclocked memory timing settings; and
wherein generating the profile comprises including the one or more subtiming settings in the profile.

16. The computer program product of claim 15, wherein the one or more subtiming settings are based on one or more rules applied to the overclocked memory frequency setting and/or the one or more memory timing settings.

17. The computer program product of claim 13, wherein the steps further comprise storing the profile in a storage location.

* * * * *